United States Patent
Kliman et al.

(10) Patent No.: US 6,300,767 B1
(45) Date of Patent: Oct. 9, 2001

(54) SYSTEM AND APPARATUS FOR PREDICTING FAILURE IN INSULATED SYSTEMS

(75) Inventors: Gerald Burt Kliman; John Raymond Krahn, both of Niskayuna; Howard Leroy Lester, Alplaus; John Stanley Glaser, Niskayuna; William James Premerlani, Scotia, all of NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/201,224

(22) Filed: Nov. 30, 1998

(51) Int. Cl.$^7$ .................................................. G01R 31/02
(52) U.S. Cl. .......................................... 324/536; 324/544
(58) Field of Search ..................... 324/509, 536, 324/520, 521, 544, 551

(56) References Cited

U.S. PATENT DOCUMENTS

| | | | |
|---|---|---|---|
| 4,006,410 | * | 2/1977 | Roberts ................................ 324/520 |
| 4,095,173 | * | 6/1978 | Darrel ................................. 324/535 |
| 4,191,921 | * | 3/1980 | Yoshino .............................. 324/547 |
| 4,779,051 | | 10/1988 | Grunewald et al. ................. 324/536 |
| 4,929,903 | * | 5/1990 | Saigo et al. .......................... 324/544 |
| 5,107,447 | * | 4/1992 | Ozawa et al. .................... 364/551.01 |
| 5,247,258 | | 9/1993 | Tripier et al. ........................ 324/536 |
| 5,315,255 | * | 5/1994 | Bettinger ............................ 324/457 |
| 5,396,180 | * | 3/1995 | Hampton et al. ..................... 324/551 |
| 5,726,574 | * | 3/1998 | Silverberg et al. .................. 324/529 |
| 5,726,576 | * | 3/1998 | Miyata et al. ....................... 324/536 |
| 5,814,998 | * | 9/1998 | Gruenewald et al. ............... 324/536 |
| 5,839,092 | * | 11/1998 | Erger et al. ............................ 702/58 |

FOREIGN PATENT DOCUMENTS 9307503   4/1993   (WO) .

OTHER PUBLICATIONS

Y. Michiguchi, et al, "Development of a Collextor Reing Monitor for Sparking Detection on Generators", IEEE Trans on Power Apparatus and Systems, vol. PAS–102, No. 4, Apr. 1983, pp. 928–933.

J. Cheng, et al, "Detection of Arcing in DC Motors", pp. 563–568. No month/year available.

C. Hudson, et al, "Discrimination Capabilities of Partial Discharge Analysis for Assessment of Generator Stator Windings", EPRI Turbine Generator Workshop, Milwaukee, WI, Aug. 1995, pp. 1–13.

* cited by examiner

Primary Examiner—Safet Metjahic
Assistant Examiner—Vincent Q. Nguyen

(57) ABSTRACT

A radio frequency (RF) or other form of detector detects discharges of an insulated system which can occur when electrical insulation becomes wet, for subsequent analysis and decision processes. Additionally, for RF detection, a frequency selector can be used to select a "quiet" region of the discharge spectrum before demodulation and further analysis and decision. Finally, redundant sets of such filters avoid the need to continuously reconfigure the detection system.

26 Claims, 6 Drawing Sheets

SYSTEM AND APPARATUS FOR PREDICTING FAILURE IN INSULATED SYSTEMS

FIELD OF THE INVENTION

This invention relates generally to the field of fault detection, and specifically to using certain emissions spectra from an insulated system to detect impending failure.

BACKGROUND OF THE INVENTION

Parallel plate busways for 600 volt (rms) systems often have high insulation failure rates when conditions are humid or wet. Most failures occur in joints between sections. A few occur in the sections between joints. Considerable damage to the loads and busway occurs when there is a failure, and down time is needed for repair. Presently, busway systems are tested off-line in an attempt to avoid sudden, unexpected, catastrophic failure. There is considerable expense and down time for periodic leakage resistance measurement (meggering) of the busway systems. Such insulation failures also occur in other types of insulated systems including transmission lines, switchgear equipment, motors, generators, transformers, capacitors, and inductors.

Partial discharge analysis is a common tool in monitoring high voltage motors and generators. Ultrasonic monitoring of exposed surfaces has been used to evaluate surface discharge conditions in motors and high voltage power lines. Chemical species detectors are widely used for safety monitoring. Additionally, as is well-known in the art, various kinds of apparatus commonly used in industry such as adjustable speed drives, and spot welders put energy into the same frequency range as the discharges that are being monitored. This can result in falsely predicting failure.

SUMMARY OF THE INVENTION

It is therefore desirable to provide a continuous on-line monitoring system for an insulated system to warn of impending failure.

To achieve this, a radio frequency (RF) or other form of detector is positioned at a selected location on the insulated system to detect discharges which can occur when electrical insulation becomes wet, for subsequent analysis and decision processes.

BRIEF DESCRIPTION OF THE DRAWING

The features of the invention believed to be novel are set forth in the appended claims. The invention, however, together with further objects and advantages thereof, may best be understood by reference to the following description taken in conjunction with the accompanying drawing(s) in which:

DETAILED DESCRIPTION OF THE INVENTION

Figure 1:
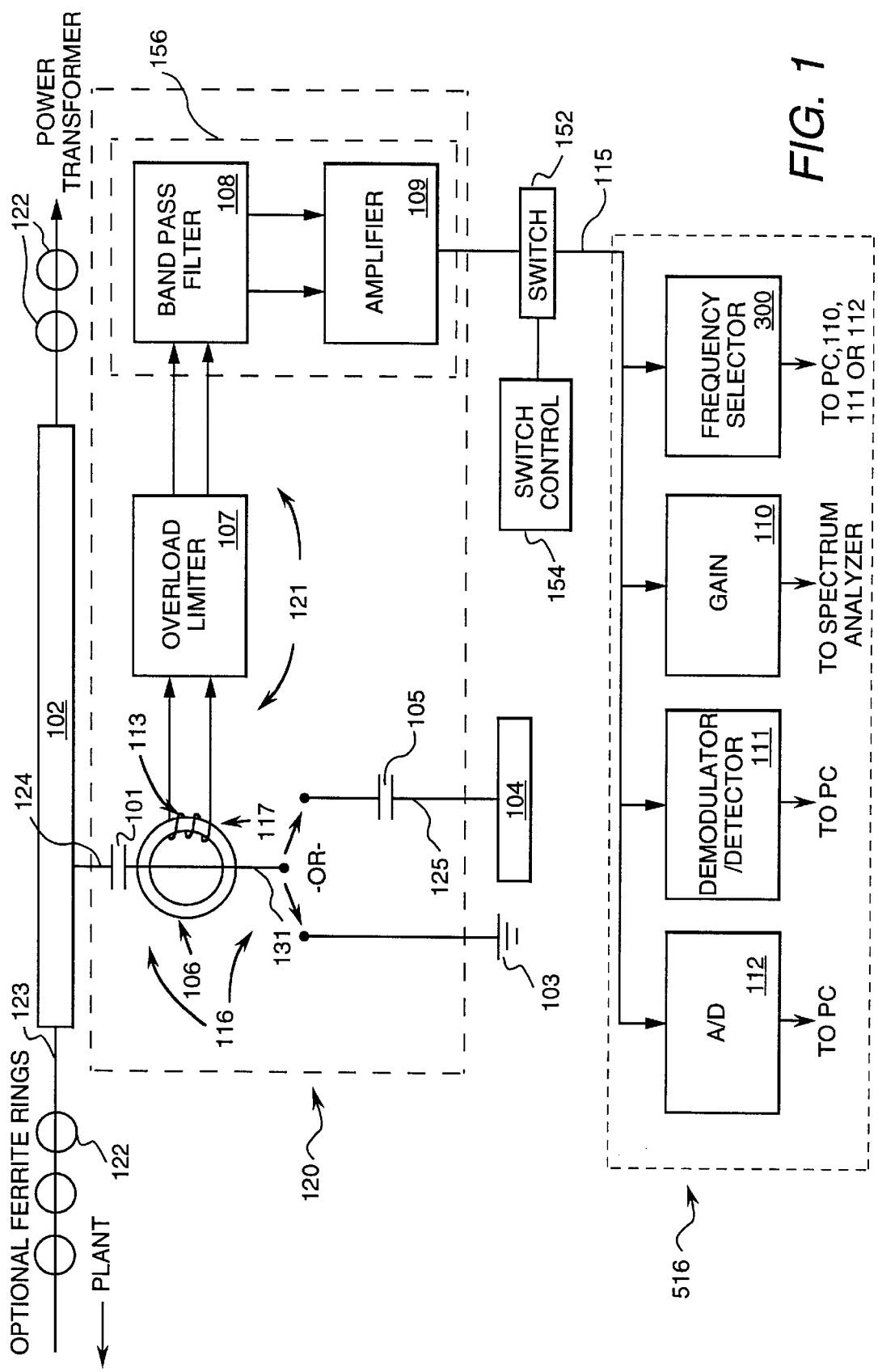
FIG. 1 is a block/circuit diagram illustrating the basic RF detector according to an embodiment of the invention.

The present invention relates to insulated systems which may experience insulation quality degradation due to causes such as moisture (from humidity or wetness), contamination, abrasions, erosions, overheating, and voids or other manufacturing defects, for example. Such systems include, for example, busways, transmission lines, switchgear equipment, motors, generators, transformers, capacitors, and inductors. For purposes of example, the following description is discussed in terms of busway systems, but the general analysis is applicable to any insulated system.

When insulators in a busway system are exposed to high humidity they can be subject to intense discharges that eventually erode the insulation material allowing conduction between busbars of differing potential and resulting in catastrophic failure. These phenomena occur mostly in the joints but also, on occasion, in the long sections between joints.

The present invention uses detection of discharge effects, separately or in combination, for failure prediction. Discharge effects include, for example, Radio Frequency (RF) emissions (conducted or radiated), mechanical vibration (audio or ultrasonic), and chemical species evolution (e.g. hydrogen and ozone).

The detection of RF emissions appears to be the least invasive technique and the lowest in cost because RF energy propagates in the busway with little attenuation and can thus be monitored at a convenient single point such as at a switchgear cabinet. Field retrofitting of a busway system for RF detection is also relatively straightforward. Capacitor(s) and transformer(s) of an RF detection input circuit are contained in a box which can be installed, for example, inside a switchgear cabinet by coupling leads to existing connections and securing the box. The box does not need power, and a single (low voltage) coaxial lead can come out of the switchgear cabinet at a convenient point and provide a signal for processing.

RF detection is the most attractive of the options for measuring discharge, due to the ease of retrofit as described above. Thus, for purposes of example, much of the detailed description below will be presented in terms of radio frequency (RF) detection. It is understood, however, that other detectors can also be used to measure discharge effects and are meant to be included within the scope of the present invention. For example, in one such embodiment, vibration sensors (e.g., accelerometers) can be attached to the outside of the busway, and installed at some or all of the joints along the busway along with wiring to a processor analyzing the detections so that the audible noise and vibration which result from a discharge can be detected. This is useful because, when the discharge is advanced, audible noise and vibration is generated, for example, in the vicinity of 120 Hz and harmonics. In another such embodiment, ultrasonic pickups (microphones) are similarly installed inside the busway at some or all joints, and with wiring to the processor used for analysis, to detect the high frequency sound (in the 40 kHz range) that is emitted by a discharge. Chemical (such as ozone & hydrogen) detectors are also possibilities, wherein chemical sensors are positioned similarly to the ultrasonic sensors to monitor changes in hydrogen or ozone that result from discharge effects.

FIG. 1 is a block/circuit diagram illustrating an RF discharge detector 120 and a data acquisition processor 516 according to an embodiment of the invention. When a discharge occurs somewhere in a busway system 5 (see FIG. 5) RF pulses will be generated with spectra usually in the range of 1 MHz to 100 MHz. These pulses will propagate along the busway system acting as a transmission line with some characteristic impedance and with propagation speeds mostly determined as a transverse electromagnetic (TEM) wave influenced by the dielectric constant. In one embodiment, the dielectric constant is around 3.5 to 4, and propagation speed will thus be somewhat slower than light speed in air. Measurements on dry busways verify these parameters and show that, under dry conditions, there is very little attenuation at the frequencies of interest. Under moist conditions it has been shown in tests that any increase in attenuation is negligible. The nature of the discharge activity is usually such that the magnitude of RF activity changes in time somewhat erratically.

Figure 5:
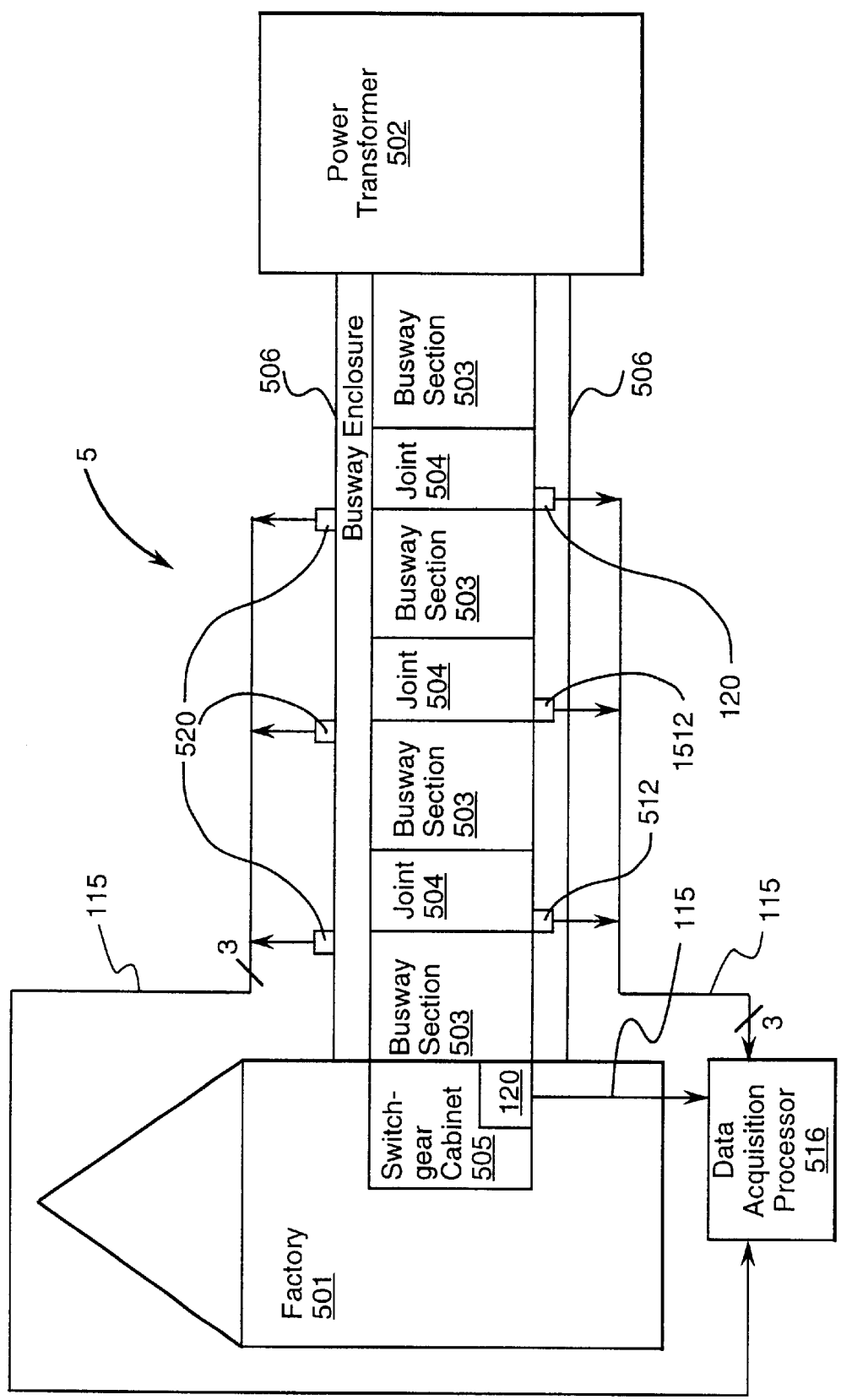
FIG. 5 is a schematic block diagram illustrating the busway, and the placement of RF sensors, accelerometers, ultrasonic sensors, and chemical sensors along the busway according to several other embodiments of the invention.

To detect the RF activity, RF discharge detector 120 is preferably placed in a switchgear cabinet inside a plant being powered by a power transformer connected by the busway system (the switchgear cabinet, plant, and power transformer are not shown in FIG. 1, but are shown in block diagram for purposes of example in FIG. 5). When there is discharge activity, the signals will propagate along the busway. A first capacitor 101 connected between a first busbar 102 (with lead 124) and ground 103 (or, optionally and preferably, to minimize common mode interference, between the first busbar and a second, adjacent busbar 104 through second capacitor 105 and lead 125) will present a low impedance to the RF voltages, and current will flow through capacitor 101 substantially following the discharge activity. This RF current in the capacitor is led by wire 131 through the window of a core 106 or the primary of an RF detector transformer 117 (usually wound on a ferrite or powder core, but sometimes wound on an air core). Wire 131 can extend straight through the core or can be wound around the core.

In the embodiment of FIG. 1 there is thus no ohmic connection between the busbars and the low voltage detection circuitry and there is enough space to provide a high level of insulation if needed due to a fault. Consequently, this approach offers a very safe method of detection. In order to assure safety and to guarantee that the RF discharge detector will not compromise the integrity of the busway system, a fuse (not shown) can be added to the circuit. Such added protection, however, will usually not be required.

Detection circuitry 121 includes secondary winding 113, an optional signal limiter 107 to avoid adverse impact such as damage or saturation due to occasional large spikes which can come from a variety of sources, a band pass filter 108 to limit interference and noise outside of the band of interest, and an RF amplifier 109 to increase the amplitude of the signals (resulting in, for example, a 100×gain). A signal conditioner 156 may include individual filter and amplifying elements 108 and 109, as shown, or signal conditioner 156 may comprise a combination of these functions.

Figure 6:
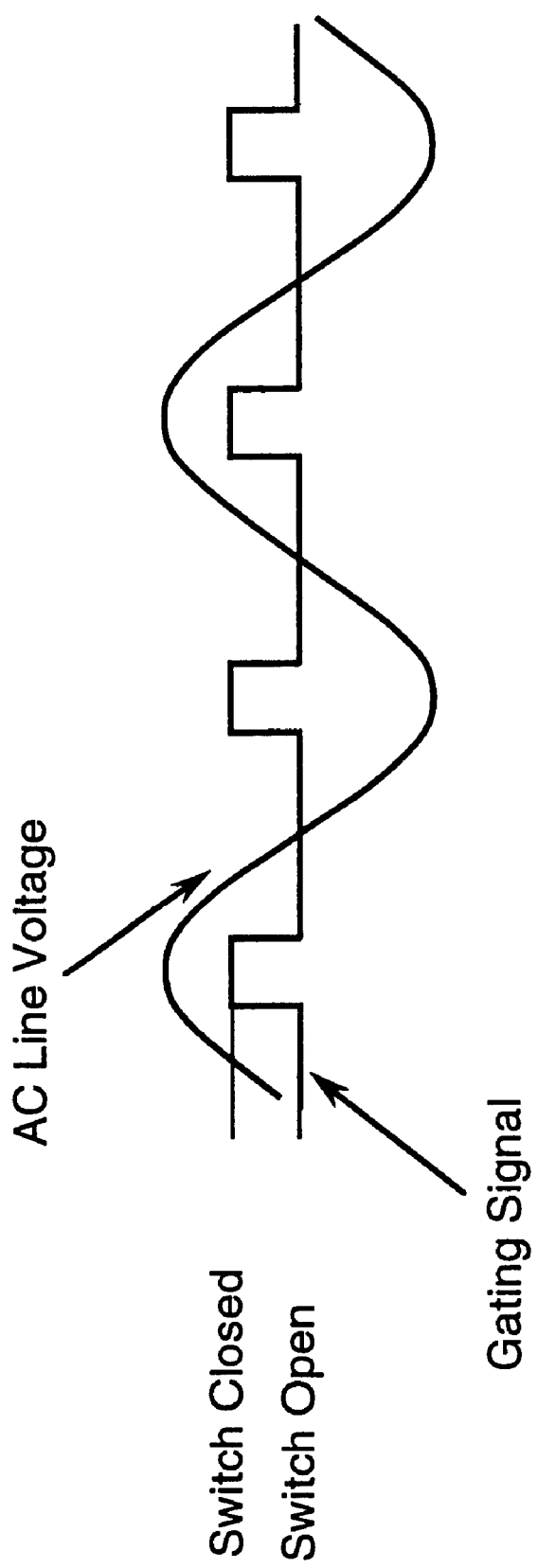
FIG. 6 is a graph of an optional switching technique for the embodiment of FIG. 1.

To increase the likelihood that only signals related to insulation failure are detected, and thereby reduce the likelihood of false positive failure indications, an optional switch 152 controlled by optional switch controls 154 can be used. Because the insulation breakdown of AC line-powered systems often (although not always) occurs at the positive and negative peaks of the AC waveform, one method of reducing extraneous signals is to only look at the signal for time intervals of less than one-half the period of the AC line voltage. The intervals at which the signal is examined are in the vicinity of the positive and negative peaks of the AC waveform wherein the optimum signal-to-noise ratio is present. The optimum ratio may be achieved by centering the intervals about the peaks or by shifting centered intervals, for example. This feature can be provided by placing an electronically controlled switch 152 between the RF detector 120 and the data acquisition processor 516. When the switch is closed, the signal is permitted to pass from RF detector 120 to data acquisition processor 516, and when the switch is open, the signal is blocked so that no signal is provided to 516. The relationship of the control signal for switch to the AC waveform is shown in FIG. 6. The duration of the time for which the switch is closed can be adjusted for the purpose of optimizing the detection of insulation failure. The switch control signal can be derived from the AC line voltage by a number of techniques, including, but not limited to, comparison to the AC line voltage or a filtered version thereof with a predetermined, adjustable threshold, or by a phase-locked loop that is locked to the AC line frequency or harmonic thereof.

The output signal 115 from amplifier 109 can be processed in data acquisition controller 516 in one or more of four ways: (1) it can be amplified 110 and sent to an external system such as an RF spectrum analyzer, (2) it can be digitized 112 at high speed and stored for transmittal to a computer or existing Power Management Control System (PMCS) at lower speed for detailed analysis, (3) it can be demodulated 111 to the audio frequency range for amplitude trending or fluctuation analysis in a standard computer system or PMCS, or (4) one or more limited frequency bands can be selected 300 from output signal 115 and then sent to a computer or PMCS for analysis, as will be discussed in more detail in connection with FIGS. 3 and 4. As stated above, these paths can be used alternatively or in combination. It is particularly useful, for example, to perform frequency selection with frequency selector 300, prior to amplifying, digitizing, and/or demodulating.

The overall detection circuitry encompasses the components and processes enclosed within broken-line box 120. Box 516 generally refers to a data acquisition processor, which for the embodiment where RF leakage is detected, encompasses the processing options 110, 111 and 112 and/or 300 as discussed above. Although the above examples refer to separate data acquisition processors and spectrum analyzers or computers, in one embodiment, the data acquisition processor can include an analyzer, computer, or PMCS or can be included in a computer or PMCS. If space in the switchgear cabinet is limited, then a signal transfer circuit 116 comprising 101 and 105, as well as detector transformer 117 and winding 113, can be placed inside the switchgear cabinet, and the remaining elements of detection circuitry 120 can be situated in another convenient location outside the switchgear cabinet.

In order to improve the signal-to-noise ratio or to reduce interference from factory equipment generating RF (such as welders or adjustable-speed drives), lossy ferrite cores 122 can be slid over cables 123 transitioning the busway to other devices. Such cores are available that will have low permeability at power frequency (50/60 Hz) but will have high permeability in selected frequency ranges as well as high losses thus absorbing much of interfering signals. In a similar manner such cores can be added at the power transformer end of the busway to limit interference from the distribution system. Alternatively, another way to reduce interference from factory equipment is to detect and compare discharge effects on multiple phases (bars or coils in the case of generators and form-wound motors) of the busway. Discharge activity of interest will be of opposite polarity on multiple phases. In contrast, generally emitted RF noise is typically equally present on all phases and of the same polarity.

In order to improve signal clarity and signal-to-noise ratio, it may be helpful to match the transmission line (busway) to eliminate reflections (by obtaining a reasonable match to the line impedance and minimizing standing waves) and to adjust for maximum transfer of energy at a desired frequency. In one embodiment, this is accomplished by designing signal transfer circuit 116 for matching purposes. In another embodiment, a standard matching network 310 is positioned between two busbars and designed to provide a minimum standing wave ratio. If desired, matching networks can be positioned or designed at both ends of the busway. Although the matching networks have been described in terms of busways, other insulated systems in which matching networks can be applied include transformers, for example. Similarly, open or short (at RF) circuits (not shown) can be added to improve detection.

While the preferred location of the RF discharge detector 120 is in the switchgear cabinet because of the convenience of mounting and connection, it may be useful to mount RF discharge detectors at other sites if access to DC or AC power for the circuit and access to the PMCS or other normally installed electronic power monitoring and control system is available. A prime candidate site is just inside the building where the busway enters. Also RF detector 120 can be installed in the busway itself by means of a specially built section where RF discharge detector 120 can be built into the busbar assembly. In another embodiment the RF discharge detector 120 is attached to the busbars at the joint. In both cases the sensors 120 are placed close to the busbars 102, 104 by the use of special joint covers (not shown) which have been made with a bubble or bump to accommodate the circuitry and are provided with sealed connections for power and signal transfer to the exterior. Location of sensors 120 in this manner will enable localization of the discharge site, and ameliorate or eliminate possible effects of increased attenuation in wet weather.

In order to make the overall RF monitoring system robust to false alarms that could be induced by factory equipment or line disturbances, a pattern recognition and classification expert system can be used. Data corresponding to a wide variety of scenarios and conditions are collected and used as a basis for learning normal RF patterns versus faulty RF characteristics. Endurance testing of insulation 153 (shown for example in FIG. 4) is used to analyze the correlation between RF activity and time-to-failure. The output of the overall monitoring system is an alarm when the RF activity generated by discharges occurring in the busway insulation reaches a certain pre-determined threshold. For each alarm, an estimate of the remaining time before a catastrophic failure which occurs with respect to some nominal atmospheric conditions is evaluated. Should several sensing devices be installed along the busway duct, the expert system can then provide the user with some information regarding the location of the predicted failure. A variety of trending and statistical techniques known in the art can be used for this purpose.

The approach outlined thus far detects the average level of the discharge activity in the RF band (usually 1 MHz to 50 MHz). This is the simplest, least invasive and lowest cost method of detecting when harmful discharges occur. Detection can be designed to include rectification, peak detection, AM demodulation, or basic diode/capacitor circuits of classic form. The slowly varying DC level and relatively low frequency fluctuations of the demodulated RF then provide a basis for trending of average activity to enable early warning of insulation degradation due to discharges.

In many application settings, however, the average activity level can be influenced by other sources of RF energy propagating into the detector. These can be discharges or other activity in apparatus on high voltage lines feeding the busway. More likely, these discharges originate within the installation fed by the busway from adjustable speed drives, welders, induction heaters, computer power supplies and the like. It is characteristic of such sources that, while they can go on and off unpredictably, their RF signature or spectrum is relatively stable. That is, they will usually inject energy into the same band of frequencies when they are on. The frequencies of these signatures are band-limited in most cases. However a simple demodulator cannot distinguish between such sources and the discharge of interest, thus reducing detection sensitivity and requiring much computation to minimize these effects.

A way to minimize these interference effects is for data acquisition processor 516 to survey the normally occurring interferences and filter them from the signal analysis. This embodiment, however, would require a number of filters individually tuned which would need to be modified when installation (e.g., plant or factory) changes are made.

Figure 2:
FIG. 2 is a frequency graph illustrating, as an example, the broad spectrum of discharge that is typical in a busway system. The range for this illustration is up to 50 MHz.

A preferred compensation technique is to select one or more frequency ranges of the broad spectrum of the discharge (shown, for example, in FIG. 2) that is relatively free of interference at the application site (e.g., plant or factory). Since the discharge range is broad (from about 1 MHz to 50 MHz in FIG. 2), at least one band or range of useful frequencies will be available somewhere within the discharge range.

Figure 3:
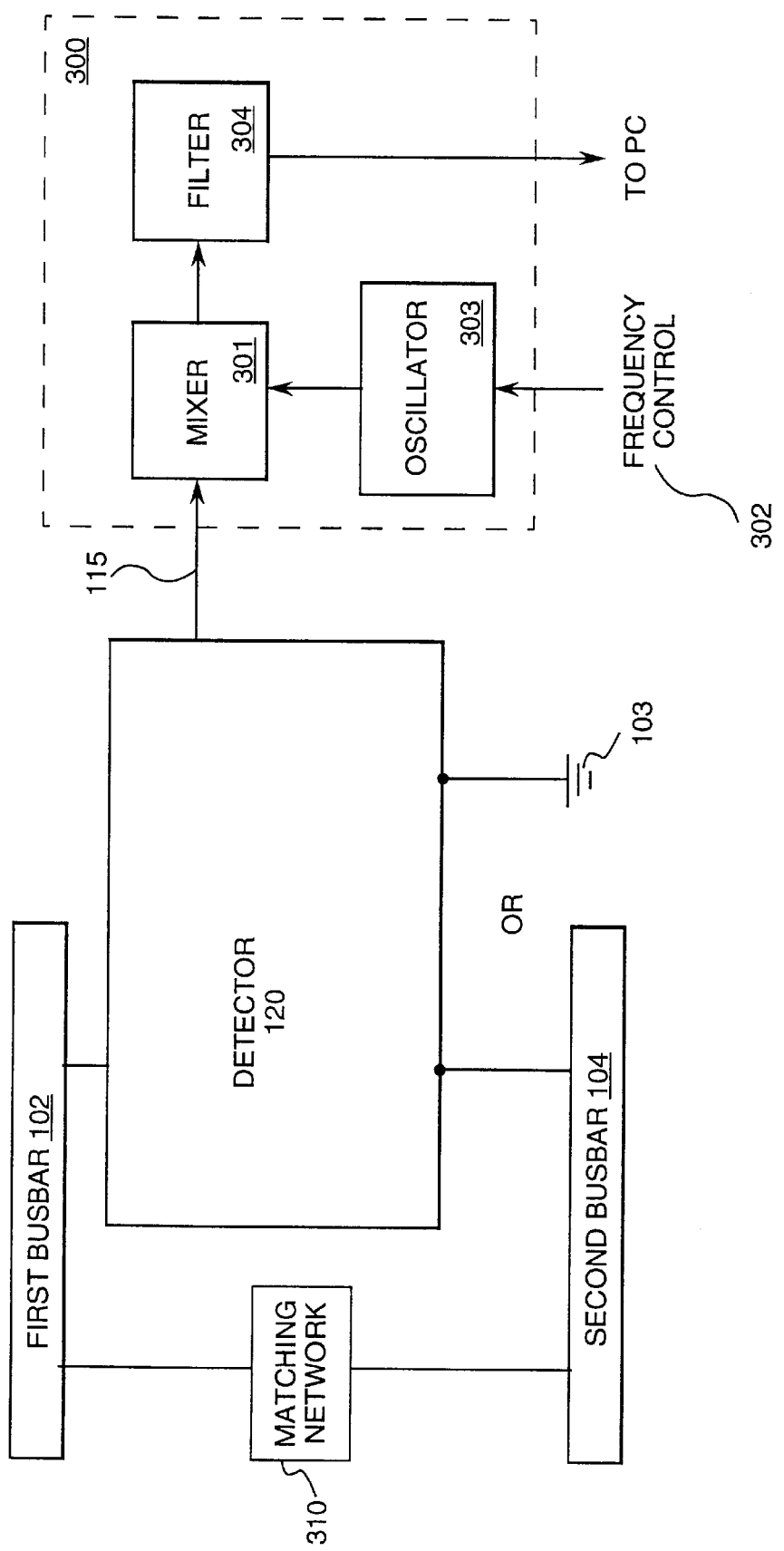
FIG. 3 is a block/circuit diagram illustrating a simple, variable band width, variable center frequency, filter system used in another embodiment of the invention.

FIG. 3 is a block/circuit diagram illustrating a simple, variable band width, variable center frequency, filter system 300 (hereinafter referred to as frequency selector 300) used for processing output signal 115 from band pass filter 109. RF discharge detector 120, as discussed in FIG. 1 includes capacitor 101, detector transformer 117, amplifier 108, and filter 109, which define the limits of the frequency range. The next step is to mix (in a mixer 301) the sensed signal with an adjustable 302 frequency source (through oscillator 303) to heterodyne it to a convenient band for filtering by filter 304. Filter 304 can be of a fixed bandwidth, or may comprise a series of overlapping filters selected to extract the most signal energy while still excluding known sources of interference. More gain can be supplied, if necessary, to properly demodulate the resultant filtered signal. The frequency output signal (or signals) selected by frequency selector 300 are then used by a computer or PMCS for analysis.

Various "converters" in the form of standard circuit chips are commonly available to accomplish demodulation in selected frequency bands. Some converters, such as Double-Balanced Mixer/Oscillators, select a band of frequencies symmetrical about the set frequency, transform the set frequency to zero and fold the two sides together. Image Reject Double Balanced Mixer Oscillator converters comprise two such chips as well as 2 phase shift circuits. These will select out one sideband, which yields greater fidelity. Since the set frequency is moved to zero, the series of overlapping filters can be simply realized, at lower cost, by a low pass RC filter with selectable capacitors. An implementation of a demodulator/filter system is shown in FIG. 4.

Figure 4:
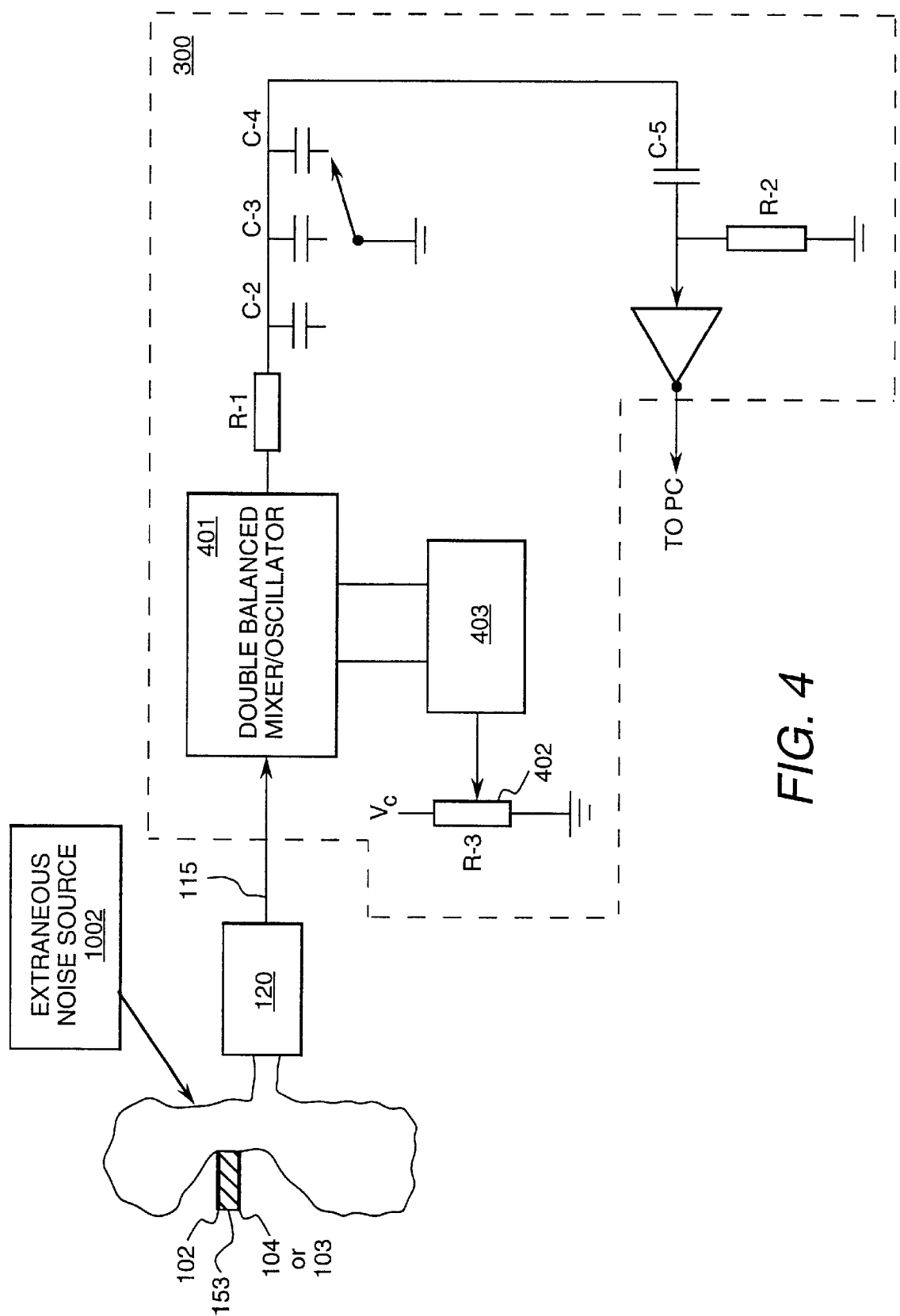
FIG. 4 is a block/circuit diagram illustrating a variable frequency and bandwidth filter system in accordance with another embodiment of the invention.

Frequency selector 300 of FIG. 4 includes a converter 401 such as, for example, an Image Reject Double-Balanced Mixer/Oscillator. The output of Image Reject Double-Balanced Mixer/Oscillator 401 operates as a direct conversion "receiver" with the output bandwidth determined by R-1*C-2, C-3, or C-4. The capacitor to be used is selected either by a manual switch or automatically by a computer program. The low end roll-off in the output signal is set by R-2*C-5. The frequency in the spectrum of the bandpass is set by R-3 via a varactor 402 associated with a variable frequency tank circuit 403. Changing the bias on the varactor (which is a diode) changes its capacitance. This capacitance is part of the variable frequency tank circuit. Thus, changing a setting on potentiometer R-3 will change the frequency and select a desired region of the input spectrum to be used.

One possible embodiment for the Image Reject Double Balanced Mixer Oscillator form of converter incorporates two Double Balanced Mixer Oscillators and two phase shift circuits using commonly-available analog hardware as described above. An alternative embodiment incorporates the same functionality in a digital circuit. It is understood that various converters which achieve the same end as the Image Reject converter are suitable for use in this embodiment of the invention.

Because frequency selection circuit is 300 adjusted to select a "quiet" region of the emission spectrum, i.e., a spectral region in which there is no extraneous noise so that any noise detected can be identified as originating from busway RF emissions, it may be useful, if only a single spectral region is examined, to readjust which spectral region is examined over time as the sources of interference change, for example, due to adding new or modifying old electronic equipment in the nearby environment, or changing operating modes.

A plurality of filters (or a plurality of frequency selectors 300 selecting the desired frequencies from one or more filters) can be used to avoid such readjustment over time. For example, if frequency selector 300 in the various embodiments shown actually comprises four selectors for RF emissions in four distinct spectral regions, or alternatively, if a single variable frequency filter such as shown in FIG. 4 is used to cyclically visit and examine four preselected bands, then the detection of a large threshold of noise in only one region, or of different noise signatures in several regions, would indicate that this noise is from extraneous sources 1002 rather than the busway. Alternatively, the detection of a consistent noise pattern at all four of the spectral regions being selected would implicate the busway itself, rather than any single extraneous noise source, since, as observed in FIG. 2, busway RF emissions are typically spread over a broad frequency range. This analysis can be carried out by a computer or PMCS.

FIG. 5 is a schematic block diagram illustrating busway 5, and the placement of RF detectors, accelerometers, ultrasonic detectors, and chemical detectors along the busway according to several alternative embodiments of the invention. Busway 5 feeds power to factory 501 (or other location receiving power) from power transformer 502. Busway 5 typically comprises a plurality of busway sections 503 and a plurality of busway joints 504 between sections 503. The switchgear cabinet 505 is shown at the end of busway 5 inside factory 501. A busway enclosure 506 surrounds the busway. Enclosure 506 typically comprises a steel shell.

As noted earlier, for the preferred embodiment which uses RF emissions, since RF signals readily propagate along the busway with minimal attenuation, only a single RF leakage detector 120 is needed, and the detector is optimally located inside switchgear cabinet 505. However, it is also possible in an alternative embodiment to locate a plurality of RF detectors 120 along the busway itself.

FIG. 5 further illustrates a plurality of inside leakage detectors 512, 1512, 120 which are inside busway enclosure 506 proximate joints 504, as well as a plurality of outside leakage detectors 520 located outside busway enclosure 506 proximate joints 504, as shown. The nature of these detectors depends on the particular embodiment.

For ultrasonic or chemical sensing respectively, a plurality of ultrasonic detectors 512 or chemical detectors 1512 are best located inside the busway enclosure. For the RF embodiment noted above wherein a plurality of RF detectors 120 are located along the busway itself, these detectors are also best located inside the busway enclosure as shown. For audio sensing, a plurality of audio vibration detectors 520 such as accelerometers are best located upon, and outside the busway enclosure. Thus, inside leakage detectors 512 may comprise ultrasonic or chemical detectors depending on the embodiment, inside leakage detectors 120 represent RF detectors in the RF embodiment that uses a plurality of detectors along the busway rather than a single RF detector in the switchgear cabinet, and outside leakage detectors 520 will typically be vibration detectors such as accelerometers.

Inside leakage detectors 512, and outside leakage detectors 520 (as well as RF detector 120) each send their output signals 115 to data acquisition processor 516, which receives and analyzes the detected data to predict failure. For RF detection, it is again observed that data acquisition processor 516 preferably includes frequency selector option 300. It is understood that in practice, only a single embodiment is generally used for a given installation. However, two or more of the disclosed embodiments can be used simultaneously in a given installation, in order to obtain two or more different types of readings which can then be cross-referenced against one another by processor 516 to further enhance the reliability of the failure prediction.

If there is one detector 512 or 520 per joint, as shown in FIG. 5, the discharge location can be identified. If there are multiple detectors but fewer than one per joint, in some cases a location can be identified by examining the pattern of responses from several of them. In one embodiment, measuring the relative time of arrival of pulses from the discharge can be used to identify a discharge location.

While only certain preferred features of the invention have been illustrated and described, many modifications, changes and substitutions will occur to those skilled in the art. It is, therefore, to be understood that the appended claims are intended to cover all such modifications and changes as fall within the true spirit of the invention.

What is claimed is:

1. A failure prediction system for predicting failure in an insulated system, the failure prediction system comprising:
   at least one RF discharge detector for generating at least one output signal representative of insulated system discharge effects; and
   a data acquisition processor receiving the at least one output signal from the at least one discharge detector and analyzing the at least one output signal to predict failure of the insulated system, the data acquisition processor comprising at least one processor type selected from the processor type group consisting of: a demodulator for demodulating the at least one output signal to an audio frequency range and at least one frequency selector for selecting at least one limited frequency band from the at least one output signal.

2. The failure prediction system of claim 1, wherein the data acquisition processor comprises the at least one frequency selector, and wherein the at least one frequency selector includes:
   a mixer mixing the output signal with an adjustable frequency source and heterodyning the output signal to a desired frequency band; and
   a filter filtering the heterodyned signal.

3. The failure prediction system of claim 1, wherein the data acquisition processor comprises the at least one frequency selector, and wherein the at least one frequency selector includes:
   a converter receiving the output signal and outputting a demodulated signal to a resistor R-1 connected to a plurality of capacitors C selectably connected to ground such that an output bandwidth of the converter is determined by R-1*C for the selected capacitor; and
   a varactor and associated variable frequency tank circuit selecting a frequency of the demodulated signal.

4. The failure prediction system of claim 1, wherein the data acquisition processor comprises the at least one frequency selector, and wherein the at least one frequency selector includes a plurality of substantially similar frequency selectors selecting frequency bands in a like-numbered plurality of distinct spectral regions, and wherein the data acquisition processor analyzes and compares the output signal in the frequency bands to determine the origin of any detected noise as between the insulated system and an extraneous noise source.

5. The failure prediction system of claim 1, wherein the data acquisition processor comprises the at least one frequency selector, and wherein the at least one frequency selector includes a single variable frequency filter used to cyclically visit and examine a plurality of preselected frequency bands, and wherein the data acquisition processor analyzes and compares the output signal in the plurality of preselected frequency bands.

6. A failure prediction system for predicting failure in an insulated system, the failure prediction system comprising:
   at least one RF discharge detector for generating at least two output signals representative of insulated system discharge effects on multiple phases of the insulated system, and
   a data acquisition processor for receiving the at least two output signals from the at least one discharge detector and comparing the at least two output signals to determine if the discharge effects from one phase to another phase are of opposite polarity to predict failure of the insulated system.

7. A failure prediction system for predicting failure in an insulated system comprising a busway including at least first and second busbars, the failure prediction system comprising:
   at least one RF discharge detector for generating at least one output signal representative of insulated system discharge effects, the at least one RF discharge detector comprising a signal transfer circuit comprising a first capacitor connected between first busbar and, by a wire, a connection point selected from a connection point group consisting of: (a) an electrical ground and (b) a second capacitor connected to second busbar, an RF detector transformer having a core, the wire extending from the first capacitor and passing through the core to the connection point, and a secondary winding wound about the core for providing a winding signal; and a signal conditioner for filtering and amplifying the winding signal to generate the at least one output signal; and
   a data acquisition processor for receiving the at least one output signal from the at least one discharge detector and analyzing the at least one output signal to predict failure of the insulated system.

8. The failure prediction system of claim 7, wherein the signal transfer circuit is designed to act as a matching network for the busway.

9. The failure prediction system of claim 7, wherein the insulated system includes a switchgear cabinet, the signal transfer circuit being positioned within the switchgear cabinet.

10. A failure prediction system for predicting failure in an insulated system comprising a busway, the failure prediction system comprising:
    at least one RF discharge detector for generating at least one output signal representative of insulated system discharge effects; and
    a data acquisition processor for receiving the at least one output signal from the at least one discharge detector and analyzing the at least one output signal to predict failure of the insulated system; and
    at least one matching network positioned across the busway.

11. The failure prediction system of claim 10, wherein the at least one matching network positioned across the busway comprises at least two matching networks positioned across opposite ends of the busway.

12. A failure prediction system for predicting failure in an insulated system comprising a busway including joints, the failure prediction system comprising:
    a plurality of discharge detectors situated proximate the joints for obtaining output signals to detect an effect of a discharge in the insulated system, each of the discharge detectors comprising at least one detector selected from the discharge detector group consisting of: a chemical discharge detector; an RF discharge detector; an ultrasonic discharge detector; and an audio vibration detector; and
    a data acquisition processor receiving the output signals from the plurality of discharge detectors and analyzing the output signals to predict failure of the insulated system.

13. The failure prediction system of claim 12, wherein the plurality of discharge detectors comprise substantially one discharge detector per each of the joints, and wherein the data acquisition processor identifies an approximate discharge location by comparing output signals from the plurality of discharge detectors.

14. The failure prediction system of claim 12, wherein the system includes more joints than discharge detectors, and wherein the data acquisition processor identifies an approximate discharge location by comparing a relative time of arrival of pulses from output signals from the plurality of discharge detectors.

15. The system of claim 12, wherein the plurality of discharge detectors comprises a plurality of RF discharge detectors.

16. A method for predicting failure in an insulated system on-line comprising:
    obtaining at least one output signal to detect an effect of a discharge in the insulated system by using at least one RF discharge detector; and
    analyzing the at least one output signal to predict failure of the insulated system by using at least one processing method selected from the processing method group consisting of:

demodulating the at least one output signal to an audio frequency range and selecting at least one limited frequency band from the at least one output signal.

17. The method of claim 16 wherein obtaining at least one output signal comprises obtaining at least two output signals representative of discharge effects on multiple phases of the insulated system, and wherein analyzing the at least one output signal further comprises analyzing the at least two output signals to predict failure of the insulated system by comparing the at least two output signals to determine if the discharge effects from one phase to another phase are of opposite polarity.

18. The method of claim 16, wherein analyzing the output signal includes selecting at least one limited frequency band from the output signal by:

mixing the output signal with an adjustable frequency source and heterodyning the output signal to a desired frequency band; and filtering the heterodyned signal.

19. The method of claim 16, wherein analyzing the output signal includes selecting at least one limited frequency band from the output signal by using an image reject double-balanced mixer/oscillator.

20. The method of claim 16, wherein analyzing the output signal includes selecting a plurality of frequency bands from the output signal using a plurality of substantially similar frequency selectors and analyzing and comparing the output signal in the frequency bands to determine the origin of any detected noise as between the insulated system and an extraneous noise source.

21. The method of claim 16, wherein analyzing the output signal includes using a frequency selector including a single variable frequency filter to cyclically visit and examine a plurality of selected frequency bands from the output signal and analyzing and comparing the output signal in the frequency bands to determine the origin of any detected noise as between the insulated system and an extraneous noise source.

22. An on-line method for predicting failure in an insulated system comprising a busway including joints, the method comprising:

obtaining output signals to detect an effect of a discharge in the insulated system by using a plurality of discharge detectors situated proximate joints of the busway, each of discharge detectors comprising at least one detector selected from the discharge detector group consisting of: an RF detector, a chemical detector, an ultrasonic detector, and a vibration detector; and analyzing the output signals to predict failure of the insulated system.

23. The method of claim 22, wherein the plurality of discharge detectors comprise substantially one discharge detector per each of the joints, and wherein analyzing further includes identifying an approximate discharge location by comparing output signals from the plurality of discharge detectors.

24. The method of claim 22, wherein the system includes more joints than discharge detectors, wherein analyzing further includes identifying an approximate discharge location by comparing a relative time of arrival of pulses from output signals from the plurality of discharge detectors.

25. A failure prediction system for predicting failure in an AC line-powered insulated system, the failure prediction system comprising:

at least one discharge detector generating at least one output signal representative of insulated system discharge effects;

a data acquisition processor receiving the at least one output signal from the discharge detector and analyzing the output signal to predict failure of the insulated system; and an electronically controllable switch for passing the at least one output signal from the at least one discharge detector to the data acquisition processor at selected intervals in the vicinity of positive and negative peaks of an AC waveform of the AC line-powered system.

26. A method for predicting failure in an AC line-powered insulated system comprising:

obtaining an output signal to detect an effect of a discharge in the insulated system; and analyzing the output signal at selected intervals in the vicinity of positive and negative peaks of an AC waveform of the AC line-powered system to predict failure of the insulated system.

* * * * *